(12) United States Patent
Silvestri et al.

(10) Patent No.: US 10,978,169 B2
(45) Date of Patent: Apr. 13, 2021

(54) PAD DETECTION THROUGH PATTERN ANALYSIS

(71) Applicant: XEROX CORPORATION, Norwalk, CT (US)

(72) Inventors: Markus Rudolf Silvestri, Fairport, NY (US); Kamran Uz Zaman, Pittsford, NY (US); Christopher P. Caporale, Rochester, NY (US); Jimmy E. Kelly, Rochester, NY (US); John M. Scharr, Canandaigua, NY (US); Alberto Rodriguez, Webster, NY (US); Dennis J. Prosser, Walworth, NY (US)

(73) Assignee: XEROX CORPORATION, Norwalk, CT (US)

( * ) Notice: Subject to any disclaimer, the term of this patent is extended or adjusted under 35 U.S.C. 154(b) by 211 days.

(21) Appl. No.: 15/462,397

(22) Filed: Mar. 17, 2017

(65) Prior Publication Data

US 2018/0268916 A1    Sep. 20, 2018

(51) Int. Cl.
*G11C 29/10* (2006.01)
*G11C 11/22* (2006.01)
(Continued)

(52) U.S. Cl.
CPC .............. *G11C 29/10* (2013.01); *G11C 29/04* (2013.01); *G11C 29/20* (2013.01); *G11C 29/44* (2013.01);
(Continued)

(58) Field of Classification Search
CPC ................................ G11C 29/04; G11C 11/22
See application file for complete search history.

(56) References Cited

U.S. PATENT DOCUMENTS 6,055,180 A   4/2000   Gudesen et al.
6,606,261 B2  8/2003   Gudesen et al.
(Continued)

FOREIGN PATENT DOCUMENTS

WO    WO2013000825 A1    1/2013

OTHER PUBLICATIONS

Author Unknown, "Thinfilm Memory Label for Brand Protection," Sales catalogue (2 pages), 2014.
(Continued)

*Primary Examiner* — Charles Rones
*Assistant Examiner* — Tian-Pong Chang
(74) *Attorney, Agent, or Firm* — MH2 Technology Law Group LLP (57) ABSTRACT

A method for ensuring that a memory array such as a ferroelectric memory array is properly electrically connected. The method may be performed, for example, prior to a read or write cycle, during functional testing of the memory array, etc. In one implementation, the memory array is read and the data set including a data bit from each cell is stored in a register. A solid logic 0's pattern is written into the memory array, and each cell is read. If no cell returns a logic 1, it is determined that the memory array is properly connected and the register data values are written to the memory array. If one or more cells returns a logic 1, it is determined that the memory array is improperly connected, the register data values are written to the memory array, and the memory array is removed and reinstalled.

18 Claims, 4 Drawing Sheets

(51) Int. Cl.
  *G06F 3/06* (2006.01)
  *G11C 29/20* (2006.01)
  *G11C 29/44* (2006.01)
  *G11C 29/04* (2006.01)

(52) U.S. Cl.
  CPC .... *G11C 11/221* (2013.01); *G11C 2029/4402* (2013.01)

(56) References Cited

U.S. PATENT DOCUMENTS

| | | | |
|---|---|---|---|
| 6,787,825 B1 | 9/2004 | Gudesen et al. | |
| 6,788,563 B2 | 9/2004 | Thompson et al. | |
| 6,804,138 B2 | 10/2004 | Thompson et al. | |
| 6,878,980 B2 | 4/2005 | Gudesen et al. | |
| 6,937,500 B2 | 8/2005 | Gudesen et al. | |
| 6,950,330 B2 | 9/2005 | Thompson et al. | |
| 6,982,895 B2 | 1/2006 | Broms et al. | |
| 7,193,881 B2 | 3/2007 | Womack | |
| 7,345,906 B2 | 3/2008 | Karlsson et al. | |
| 8,184,467 B2 | 5/2012 | Broms et al. | |
| 8,607,105 B1* | 12/2013 | Crosland | G11C 29/52 714/718 |
| 9,330,788 B2* | 5/2016 | Anzou | G11C 29/4401 |
| 2004/0062071 A1* | 4/2004 | Rodriguez | G11C 11/22 365/145 |
| 2008/0013361 A1* | 1/2008 | Miyakawa | G11C 7/18 365/145 |
| 2008/0209294 A1* | 8/2008 | Brink | G11C 29/12 714/735 |
| 2008/0243428 A1* | 10/2008 | Kim | G01R 31/2891 702/152 |
| 2009/0285981 A1 | 11/2009 | Dyreklev et al. | |
| 2010/0023817 A1* | 1/2010 | Park | G11C 29/08 714/718 |
| 2012/0226963 A1* | 9/2012 | Bivens | G11C 29/76 714/773 |
| 2013/0007542 A1* | 1/2013 | Carman | G06F 11/106 714/710 |
| 2013/0061094 A1* | 3/2013 | Busch | G06F 11/2215 714/27 |
| 2014/0082453 A1* | 3/2014 | Sikdar | G11C 29/808 714/763 |
| 2014/0210026 A1 | 7/2014 | Karlsson et al. | |
| 2014/0216791 A1 | 8/2014 | Karlsson et al. | |
| 2015/0146345 A1 | 5/2015 | Kamath et al. | |
| 2015/0318059 A1* | 11/2015 | Dragula | G11C 29/52 714/719 |
| 2017/0192840 A1* | 7/2017 | Jeansonne | G06F 11/006 |

OTHER PUBLICATIONS

Author Unknown, "Thinfilm NFC Barcode," Sales catalogue (2 pages), 2014.
Caporale et al., "Security Enhancement of Customer Replaceable Unit Monitor (CRUM)," U.S. Appl. No. 15/044,046, filed Feb. 16, 2016.

* cited by examiner

PAD DETECTION THROUGH PATTERN ANALYSIS

TECHNICAL FIELD

The present teachings relate to the field of electronic circuits and, more particularly, to methods for memory device writing, reading, and/or functional testing.

BACKGROUND

Electronic components including memory are used in electronic devices such as computers, printers, copiers, etc. Modular designs of electronic devices allow for replacement of the electronic components by the manufacturer and/or end user. Particular forms of these electronic components may be referred to as "customer-replaceable unit monitors" (CRUMs), and may include ink and toner cartridges, xerographic modules, fuser assemblies, memory components, as well as other electronic device subsystems. While end-user replacement of components is convenient and cost effective for the consumer, components that are not produced by the original equipment manufacturer (i.e., non-OEM components) or licensed suppliers may be of low quality, have problems with compatibility, and can create warranty issues with results that are unsatisfactory to a consumer.

In particular, substandard counterfeit components may, illegally, include manufacturer markings and trademarks that lead the consumer to believe the component is produced by an OEM. In addition to diverting sales revenues away from the OEM, early failure of the counterfeit component may result in decreased brand loyalty.

While a replaceable component may be manufactured by the OEM to include anti-counterfeiting measures, the revenue potential of counterfeit components is high and black market suppliers are increasingly sophisticated and well funded. Holographic markings and seals may be accurately recreated and encrypted electronic signatures can be broken, and thus have limited success in preventing copying of components. Security measures must be continually improved to ensure that customer-replaceable products remain protected from counterfeiting.

Additionally, stand-alone memory devices and other replaceable components are often inserted by the manufacturer or end user into an electronic device. These replaceable components must be properly inserted to ensure correct functionality of the component. If inserted incorrectly, the component may fail. In some cases, an error message may be provided, for example, on a display. In other cases, no error message is provided but an inoperable or malfunctioning device provides an operator or user with an indication that the component is incorrectly inserted. In either case, the operator or user may remove and correctly reinstall the component.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation, a method for operating a memory array includes performing a first read cycle on a plurality of memory cells of the memory array, wherein the performing of the first read cycle returns an original data set from the memory array and each memory cell of the plurality of memory cells is configured to store at least a first data bit and a second data bit, storing the original data set in a memory register, and performing a first write cycle to the memory array, wherein the first write cycle includes writing a test pattern to the memory array, the test pattern including only the second data bit. The method further includes, subsequent to performing the first write cycle, performing a second read cycle on the plurality of memory cells of the memory array, wherein the performing of the second read cycle returns a test data set from the memory array and comparing the test data set to the test pattern. Responsive to the test data set matching the test pattern, the memory array is passed. Responsive to the test data set not matching the test pattern, the memory array is failed.

In another implementation, a method for testing an installation of a ferroelectric memory array into a host device includes installing the ferroelectric memory array into the host device. The ferroelectric memory array includes a plurality of word lines, a plurality of bit lines, a ferroelectric layer positioned between the plurality of word lines and the plurality of bit lines, and a plurality of memory cells, wherein each memory cell includes the ferroelectric layer at an intersection of one of the word lines and one of the bit lines, and each memory cell is configured to store a first data bit defined by a first polarization vector where the ferroelectric memory points toward the word line, and a second data bit defined by a second polarization vector where the ferroelectric memory points toward the bit line. The method further includes writing an actual data set to the plurality of memory cells and storing the actual data set into the plurality of memory cells of the ferroelectric memory array. With the ferroelectric memory array installed in the host device, a first read cycle is performed on the plurality of memory cells of the ferroelectric memory array, wherein the performing of the first read cycle returns an original data set from the plurality of memory cells. The method further includes storing the original data set in a memory register and performing a first write cycle to the plurality of memory cells of the ferroelectric memory array, wherein the first write cycle includes writing a test pattern to the ferroelectric memory array, the test pattern including only the first data bit. Subsequent to performing the first write cycle, a second read cycle is performed on the plurality of memory cells of the ferroelectric memory array, wherein the performing of the second read cycle returns a test data set from the ferroelectric memory array. The test data set is compared to the test pattern. Responsive to the test data set matching the test pattern, the ferroelectric memory array is passed. Responsive to the test data set not matching the test pattern, the ferroelectric memory array is failed.

BRIEF DESCRIPTION OF THE DRAWINGS

The accompanying drawings, which are incorporated in and constitute a part of this specification, illustrate implementations of the present teachings and, together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc. Unless otherwise specified, the word "polymer" encompasses any one of a broad range of carbon-based compounds formed from long-chain molecules including thermoset polyimides, thermoplastics, resins, polycarbonates, epoxies, and related compounds known to the art.

Achieving reliable electrical connections (electrical interconnects) between electronic devices and electronic components that are installed into the electronic devices becomes more challenging with increasing electronic component complexity such as higher memory resolutions. A memory device in module form may be inserted into a socket through which the memory component communicates with other components such as one or more microprocessors. Typically, an incorrectly installed memory component will fail either wholly or intermittently, thereby providing an indication to a manufacturer or end-user that the component is incorrectly installed. The incorrectly installed memory may then be removed and reinstalled, for example, reseated into a socket.

Figure 1:
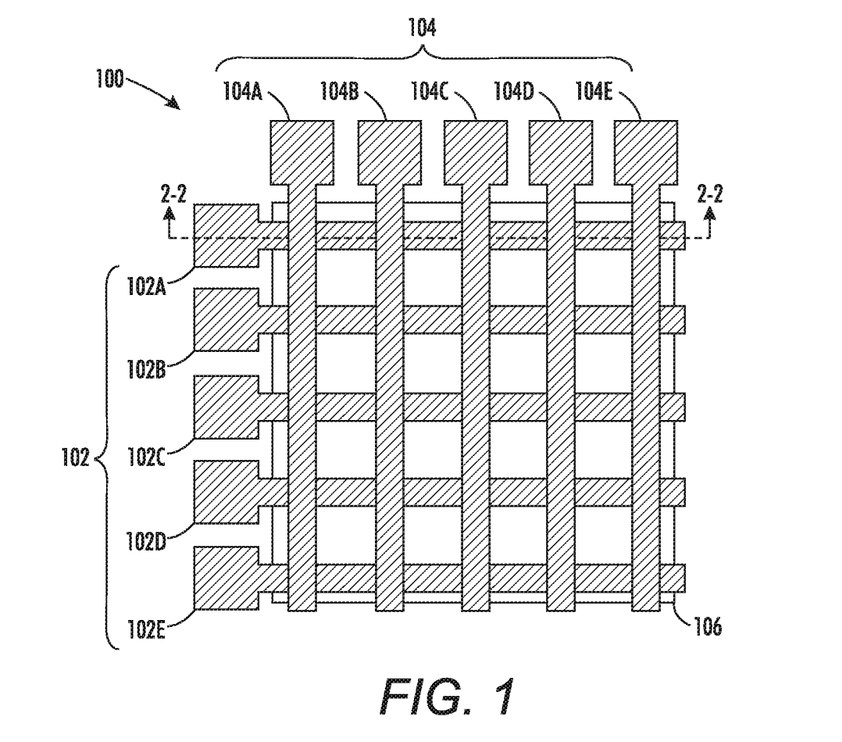
FIG. 1 is a schematic plan view of a memory array in accordance with an implementation of the present teachings.
Figure 2:
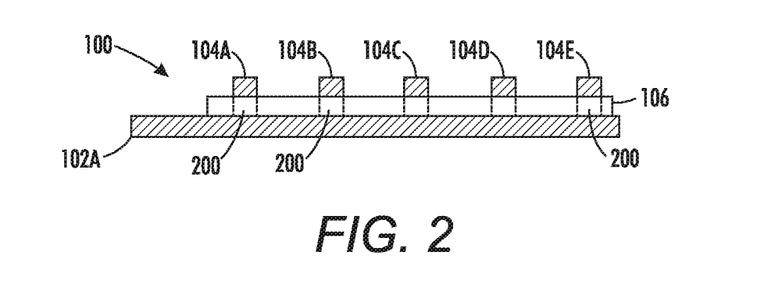
FIG. 2 is a schematic cross section along 2-2 of the FIG. 1 structure.

FIG. 1 is a plan view, and FIG. 2 is a cross section along 2-2 of FIG. 1, depicting a memory array 100 such as a ferroelectric memory device 100, for example, an organic ferroelectric memory (OFM) device 100. The OFM device 100 depicted includes a plurality of word lines 102 (e.g., five word lines 102A-102E depicted), a plurality of bit lines 104 (e.g., five bit lines 104A-104E depicted), and a ferroelectric layer 106 such as a ferroelectric polymer positioned between the plurality of word lines 102 and the plurality of bit lines 104. Word lines 102 and bit lines 104 may be referred to herein collectively as "wiring lines." Further, while the ferroelectric memory device 100 depicted in FIGS. 1 and 2 includes 25 memory cells 200 (FIG. 2) in uniform a 5×5 array or matrix layout design, it will be understood that other cell densities and other layout designs are contemplated. The ferroelectric layer 106 may be a blanket layer including a ferroelectric material that functions as a plurality of memory cells 200 (FIG. 2) or storage locations at the intersection of each word line 102 with each bit line 104. It will be understood that an actual OFM device 100 may include other features such as read and write circuitry that have not been depicted for simplicity, while various depicted features may be removed, relocated, or modified. Ferroelectric memory devices are available from Thin Film Electronics ASA, also known as Thinfilm, of Oslo, Norway.

The ferroelectric material that forms the ferroelectric layer 106 includes a crystal structure that may be selectively polarized in one of two binary data bits or logic states. As used herein, each memory cell 200 may include one of two binary states, either a "0" state or a "1" state. In the 0 state, with reference to FIG. 1, a polarization vector of the ferroelectric material points toward the word line 102 (i.e., away from the reader) and away from the bit line 104. In other words, with reference to FIG. 2, in the 0 state the polarization vector points toward the word line 102 (i.e., toward the bottom of the page). In the 1 state, with reference to FIG. 1, the polarization vector of the ferroelectric material points toward the bit line 104 (i.e., toward the reader) and away from the word line 102. In other words, with reference to FIG. 2, in the 1 state the polarization vector points toward the bit line 104 (i.e., toward the top of the page). This binary polarization occurs within the crystal structure of the ferroelectric material, wherein the crystals of the ferroelectric material are oriented in one of the two directions indicated above at the intersection of each word line 102 with one of the bit lines 104 that forms each memory cell 200.

Each memory cell 200 of the OFM device 100 may be individually addressed (i.e., individually written to and read from) by applying suitable read voltage biases to read one of the memory cells 200, or suitable write voltage biases to write one of the memory cells 200, on each of the word lines 102 and bit lines 104 such that each memory cell 200 is individually addressable. Reading and writing of ferroelectric memory is well known and understood by one of ordinary skill in the art, and is therefore not described herein for simplicity.

Figure 3:
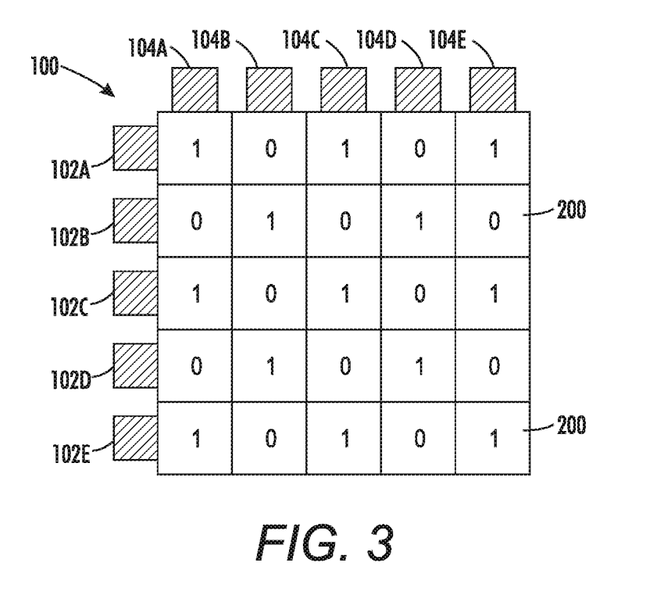
FIG. 3 is a schematic plan view of the FIG. 1 memory array storing a binary checkerboard pattern.
Figure 4:
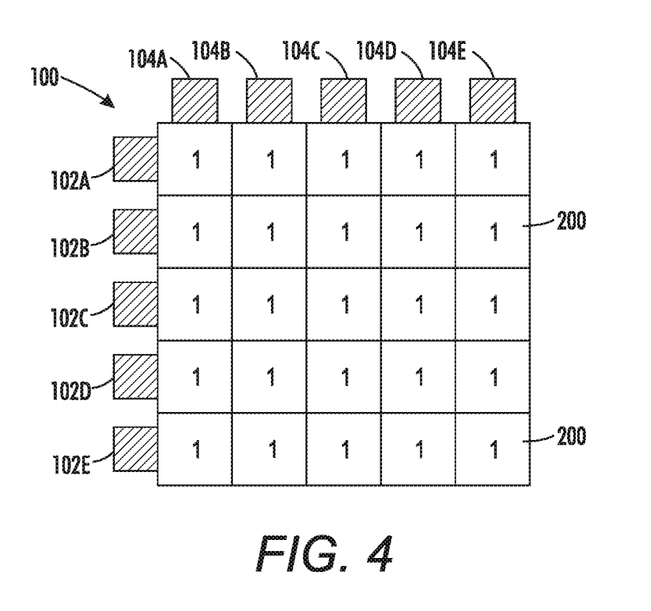
FIG. 4 is a schematic plan view of the FIG. 1 memory array after a read cycle, in which a polarization vector state of each cell after the read is represented as a logic 1.

FIG. 3 is a schematic plan view of the device 100 of FIG. 1 where the 5×5 array of memory cells 200 have been written with 0's and 1's in a binary checkerboard pattern as shown. (It will be appreciated that only logic 0's are written, as all cells are initially in the logic 1 state after an erase or read operation and therefore logic 1's need not be individually written to those cells.) During a read cycle, the ferroelectric crystals of cells that are polarized in the "0" state (i.e., the polarization vector of the crystals in the memory cell point away from the bit line 104 and toward the word line 102) flip or rotate to the "1" state (i.e., such that the polarization vector of the crystals in the memory cell point away from the word line 102 and toward the bit line 104). This flipping of the ferroelectric crystals induces a current that is integrated into a charge value and is measured to determine that the cell was storing a "0". If no flipping of crystals during a read occurs, no charge value (or a smaller charge value equivalent to a capacitive value of the cell) is integrated from the cell into the measurement and it is thus determined that the cell was storing a "1". Therefore, at the end of a read cycle, the ferroelectric crystal state (i.e., polarization vector) and logic state of each data bit stored on each memory cell 200 is the same for all read cells as depicted in FIG. 4. The process of reading each memory cell 200 of the memory array 100 flips all logic 0's stored in the original correct data set of the memory array 100 to logic 1's as depicted in FIG. 4.

Figure 5:
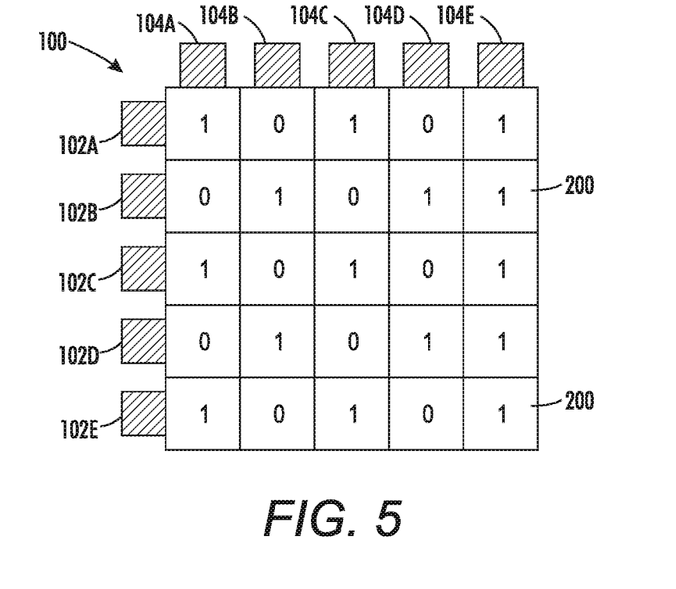
FIG. 5 is a schematic plan view depicting a binary data set read from a memory array storing the binary checkerboard pattern of FIG. 3 when one of the bit lines (e.g., 104E) is improperly connected and electrically floating.

If a memory array 100 in component form is improperly seated when installed into an electronic device, the electrical connection for one or more of the wiring lines 102, 104 may not make proper electrical contact with the electronic device, for example, with one or more pins of a socket or other electrical interface (i.e., electrical interconnect). If a wiring line remains unconnected, all memory cells along the unconnected wiring line will electrically float. When read, all floating cells will be read as a logic 1, because cells storing a logic 0 will not flip and thus will not produce a current for integration into the output of the memory device. Further, the user will not be aware that the wiring line is improperly connected because, although the values read may be incorrect for the logic 0's stored in the memory array, the output is valid had the memory cells 200 been storing a 1. For example, if bit line 104E of FIG. 3 is improperly connected, the actual logic state of the 5×5 array is as depicted in FIG. 3 while the logic state read from the 5×5 array will be as depicted in FIG. 5, where each memory cell 200 addressed by bit line 104E is read as a logic 1 regardless of the actual logic state. Because the data set read appears to be valid, the user is not aware that the wiring line 104E and the memory array 100 is not properly connected.

In one implementation of the present teachings, a method for performing a memory operation for one or more memory cells, for example, for one or more ferroelectric memory cells that may be part of an array of ferroelectric memory cells, includes a pattern analysis to determine whether one or more of the wiring lines (i.e., one or more of the word lines 102 and/or bit lines 104) of a memory array 100 is not properly electrically connected. This may result, for example, from an improperly installed or seated memory module or other electronic component within an electronic system, electronic subsystem, electronic device, test fixture, etc. For example, word line pads and bit line pads (i.e., the expanded ends of the word lines 102 and the bit lines 104 as depicted in FIG. 1) may not be properly connected to a socket or other connector. If the method determines that one or more of the wiring lines is not properly electrically connected, the problem may be corrected, for example, by reseating or reinstalling the memory component. The method described herein maintains the correct logic state of each cell in the array such that the correct data set is not lost.

Figure 6:
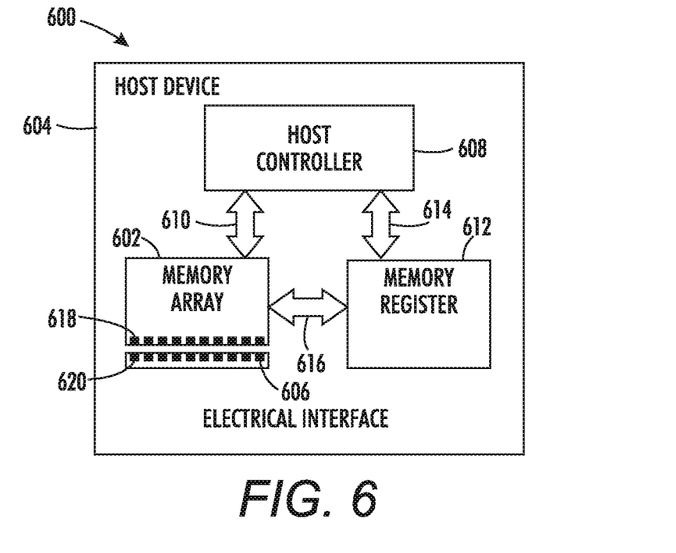
FIG. 6 is a schematic view of an electronic device including a memory array according to an implementation of the present teachings.

FIG. 6 is a schematic depiction of an electronic device 600 that includes a memory array 602 installed into a host device 604. The electronic device 600 may be or include, for example, a computer, a printer, another type of electronic device, or a subsystem for one of the foregoing. The memory array 602 may be the same or different than the memory array 100 of FIGS. 1-5. The memory array 602 may be or include part of memory system that is used as memory by a manufacturer or end user, and may be or include a ferroelectric memory array such as an OFM array. The memory array 602 may further be or include part of an authentication system used to confirm that a customer-replaceable unit monitor (CRUM) is an authentic (i.e., not a counterfeit or unauthorized) component produced by, or authorized by, a manufacturer. The memory array 602, which may be supplied as a memory module or as another form, may be inserted or installed into the electronic device 600 using an electrical interface 606 such as a memory socket, memory slot, ball grid array, or another suitable electrical interface 606. The electrical interface 606 allow allows the memory array 602 to be inserted, removed, and/or replaced from the host device 604.

The host device 604 may include a host controller 608 that controls and/or coordinates internal functionality of the host device 604. The host controller 608 may further control and/or coordinate functionality with other systems or subsystems (not individually depicted for simplicity) in electrical (e.g., wired and/or wireless) communication with the host device 604. The host controller 608 may communicate with the memory array 602 through a first data bus 610 that may be or include the electrical interface 606 or another type of first data bus 610. The host device 604 may further include a memory register 612 that may communicate with the host controller 608 through a second data bus 614. The memory register 612 may be provided as part of the memory array 602, or it may be a component separate from the memory array 602. The memory register 612 may communicate indirectly with the memory array 602 through the host controller 608 using the second data bus 614 and the first data bus 610. The memory register 612 may communicate directly with the memory array 602 through a third data bus 616, or through none, one, two, or all three of the data buses 610, 614, 616. Data buses 610, 616 may route data to and from the memory array 602 through the electrical interface 606.

The memory array 602 may include a plurality of memory array electrical contacts 618 that electrically connect or electrically couple with the word lines 102 and the bit lines 104 (FIG. 1) of the memory array 602. In an implementation, the plurality of memory array electrical contacts 618 may be the word lines 102 and bit lines 104. In another implementation, the plurality of memory array electrical contacts 618 may be or include conductive pads electrically coupled to interconnect lines that carry electrical signals from the memory array 602. The memory array 602 may be attached to a printed circuit board (PCB), where signals to and from the wiring lines are carried by electrical interconnects on or within the PCB that are routed to the electrical contacts 618. The memory array electrical contacts 618 may electrically connect or electrically couple with electrical interface contacts 620 of the electrical interface 606. The electrical interface contacts 620 may be or include part of the first data bus 610, or may be part of another data bus or another communication technique.

Figure 7:
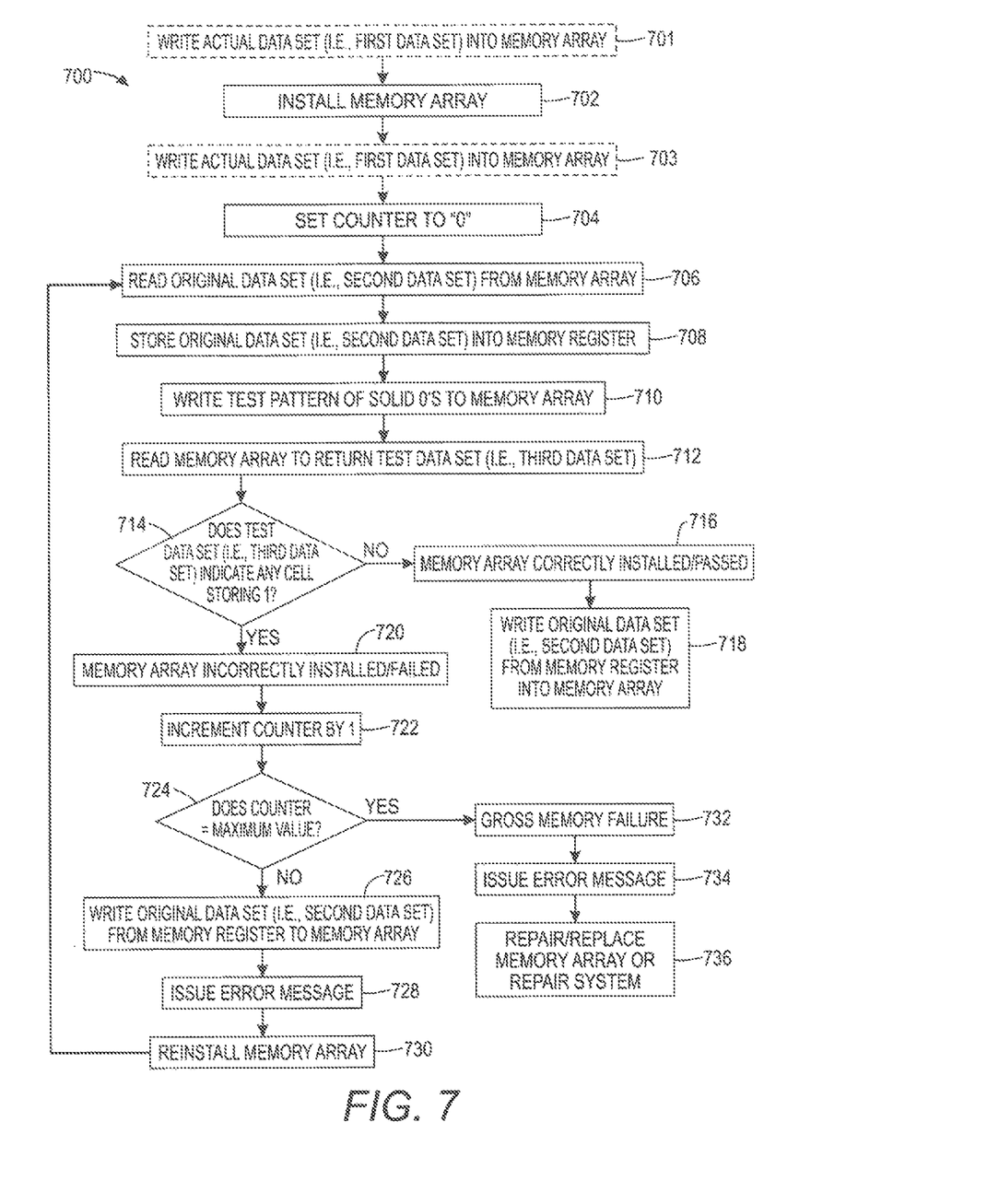
FIG. 7 is a flow chart or flow diagram depicting a method for testing a connection state of a memory array according to one implementation of the present teachings.

FIG. 7 is a flow chart or flow diagram depicting a method 700 for operating a memory array. The operating of the memory array may include testing, checking, or confirming a connection state of a memory array according to one implementation of the present teachings, for reading and/or writing a memory array, or for operating a memory array in place of, or in addition to, these operations. The method 700 may proceed by operation or use of one or more of the structures depicted in the figures described above, and thus is described with reference to FIGS. 1-6; however, it will be appreciated that the method 700 is not limited to any particular structure or use unless expressly stated herein. The method 700 may be performed as a testing process separate from any other operational processes, for example, during functional testing of the memory array, or the method 700 may be performed before, during, or after other processes, for example, as an initialization process prior to, or in conjunction with, a read and/or a write cycle. It will be appreciated that while the process is described as a series of acts or events, the present teachings are not limited by the ordering of such acts or events. Some acts may occur in different orders and/or concurrently with other acts or events apart from those described herein. Further, a method in accordance with the present teachings may include other acts or events that have not been depicted for simplicity, while other depicted acts or events may be removed or modified.

As shown at 702, the memory array 100, 602, may be installed into a host device 604 such as an electronic device, a test fixture (for example, a ferroelectric memory array test fixture), etc. In an implementation, the plurality of memory cells 200 of the memory array 100, 602 may be written with a data set (e.g., actual data set, correct data set, or "first data set") before installation into the host device 604, for example, by a manufacturer for use as an authentication device, as at 701. If the memory array 100, 602 has not been written prior to installation, the actual data set may be written into the memory array 100, 602 after the installation 702 as at 703. Either or both of 701 and 703 writes the actual data set into the memory array such that the memory array stores the actual data set.

Next, an optional counter may be initialized, for example, set to "0" as at 704 for use as described below. Subsequently, a first read cycle or operation is performed on the memory array as at 706 which returns an original data set (i.e., a "second data set") from the memory array. As described below, the original data set that is read may be identical to the actual data set (if the memory array is properly installed) or the original data set may be different from the actual data set (if the memory array is improperly installed). In either case, the original data set returned from the memory array is stored, for example, into a memory register 612 as at 708.

Next, a first write cycle or operation is performed to write a test pattern of solid logic 0's to the memory array 100, 602 as at 710. In other words, appropriate biases are applied to the individual cells in a successive manner that would successfully write a logic 0 to each memory cell 200 in a correctly installed the memory array. After performing the first write cycle, a second read cycle is performed on the memory array 100, 602 as at 712. The second read cycle returns a test data set (i.e., a "third data set") from the memory array 100, 602. In a normally operating memory array, the test data set returned from the memory array 100, 602 in response to the second read cycle would match the test pattern of solid 0's in response to a read cycle. The test data set returned is compared to test pattern as at 714. Responsive to the test data set matching the test pattern, the memory array 100, 602 is determined to be correctly installed or is otherwise passed as at 716. In other words, if no memory cell 200 from the memory array 100, 602 returns a logic 1 in response to the read at 712 (i.e., if every memory cell 200 returns a logic 0), the memory array 100, 602 is determined to be correctly installed as at 716. If it is determined that the memory array 100, 602 is correctly installed and is passed as at 716, the original data set from the memory register 612 is written back into the memory array 100, 602 as at 718, and the electronic device 600 is deemed to be functional with regard to memory array installation. For the correctly installed memory array, the original data set (i.e., the second data set) will match the actual data set (i.e., the first data set).

Responsive to the test data set resulting from the second read at 712 not matching the test pattern when compared at 714, the memory array is determined to be improperly installed or is otherwise failed. For example, if one or more memory cells 200 returns a logic 1 when read at 712, it is determined that the memory array 100, 602 is incorrectly installed or is otherwise failed as shown at 720. An incorrect installation may include one or more wiring lines not being properly connected to or coupled with the electrical interface 606, for example, through one or more of the electrical interface contacts 620. Memory cells 200 addressed by improperly connected wiring line(s) electrically float and cannot be either read from or written to. In this case, an entire row of memory cells 200 will all typically return a logic 1 if a word line 102 is improperly connected, or an entire column of memory cells 200 will all typically return a logic 1 if a bit line 104 is improperly connected. If fewer than all memory cells 200 within a row or column returns a logic 1, it is likely that the failure is due to some other failure mode such as a malfunctioning single memory cell 200 or group of memory cells 200. Analysis may be performed on the returned values to determine the actual failure mode.

Once it is determined that a memory array 100, 602 is incorrectly installed as at 720, the optional counter may be incremented by 1 as at 722. If the counter does not equal a maximum predetermined value as at 724, the original data set from the memory register 612 is written into to the memory array 100, 602 as shown at 726. The memory cells 200 that were correctly read may be correctly written with the data values from the original data set in the memory register 612. The data values from the floating memory cells 200 that could not be correctly read during the first read cycle at 712 are not affected by the first read cycle (i.e., the logic 1's were not overwritten with the logic 0's of the test pattern). Further, the floating memory cells 200 are not affected by the write cycles. Thus the floating memory cells do not lose their correct data set logic state during either the read at 706 or the write at 708. An error message may be issued on a display (not individually depicted for simplicity), through an audible tone, or using another technique to alert the user that the memory array 100, 602 is improperly installed as shown at 728. At 730, the user may uninstall and reinstall or reseat the memory array 100, 602. After the memory array 100, 602 is reinstalled, the memory array 100, 602 may be read again as depicted at 706, where the method may continue according to the method 700.

This method described above may continue in accordance with the present teachings for one or more iterations through the flow chart of FIG. 7. The optional counter tracks the number of method iterations that have been preformed. At 722 and 724, if the counter is incremented to equal the maximum value, it may be determined that there is a gross memory failure as shown at 732 rather than an improper installation. If this occurs, an error message may be issued as at 734 that the memory array 100, 602 or some other system component such as the electrical interface 606 is malfunctioning, which may be repaired or replaced as shown at 736.

It will be appreciated by one of ordinary skill in the art that the polarization vectors and data bits assigned as logic 0 and logic 1 above are arbitrary and may be reversed. In any case, each memory cell of the memory array may be configured to store at least a first data bit and a second data bit. In one implementation, the first data bit may be assigned as a logic 0 and the second data bit is assigned as a logic 1. In another implementation, the first data bit may be assigned as a logic 1 and the second data bit is assigned as a logic 0. However, in general, for a ferroelectric memory implementation, the test pattern written at 710 will include only the data bit that flips polarization during a read cycle.

It will be further appreciated that, for a functional and correctly installed memory array, the original data set (i.e., second data set) read from the memory array at 706 and the original data set (i.e., second data set) stored in the memory register at 708 will match the actual data set (i.e., first data set) stored in the memory array as at 701 and/or 703 prior to the read cycle at 706. Further, in the functional and correctly installed memory array, the test pattern written to the memory array at the write cycle of 710 will match the test data set (i.e., third data set) returned from the memory array during the read cycle of 712. However, for a nonfunctional and/or improperly installed memory array, the original data set (i.e., second data set) read from the memory array at 706 and the original data set (i.e., second data set) stored in the memory register at 708 may be different than the actual data set (i.e., first data set) stored in the memory array at 701 and/or 703. Further, in the nonfunctional and/or incorrectly installed memory array, the test pattern written to the memory array at the write cycle of 710 may not match the test data set (i.e., third data set) returned from the memory array during the read cycle of 712.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for operating a memory array, comprising:
performing a first read cycle on a plurality of memory cells of the memory array, wherein the performing of the first read cycle returns a second data set from the memory array and each memory cell of the plurality of memory cells is configured to store at least a first data bit and a second data bit;
storing the second data set in a memory register;
performing a first write cycle to the memory array, wherein the first write cycle comprises writing a test pattern to the memory array, the test pattern comprising only logic zero bits;
subsequent to performing the first write cycle, performing a second read cycle on the plurality of memory cells of the memory array, wherein the performing of the second read cycle returns a third data set from the memory array;
comparing the third data set to the test pattern;
responsive to the third data set matching the test pattern, passing the memory array and writing the second data set into the memory array;
responsive to the third data set not matching the test pattern, failing the memory array, writing the second data set to the failing memory array that failed, and performing an analysis on results of the memory array that failed to determine a failure mode of the memory array, wherein the writing of the second data set to the failing memory array does not result in the second data set being stored in the failing memory array, wherein the failure mode comprises a failure of an entire row of memory cells, an entire column of memory cells, a single memory cell, or a group of memory cells.

2. The method of claim 1, further comprising:
installing the memory array into a host device prior to performing the first read cycle;
uninstalling the memory array from the host device responsive to the failing of the memory array;
reinstalling the memory array into the host device after the uninstalling of the memory array; and
performing another first read cycle on the plurality of memory cells of the memory array subsequent to the reinstalling of the memory array into the host device.

3. The method of claim 2, further comprising:
responsive to the failing of the memory array, incrementing a counter; and
responsive to the counter equaling a maximum value, repairing or replacing the memory array.

4. The method of claim 2, further comprising storing a first data set into the memory array prior to the first read cycle, wherein:
prior to the reinstalling of the memory array into the host device, the second data set returned from the memory array resulting from the first read cycle, and the second data set stored in the memory register, do not match the first data set stored in the memory array prior to the first read cycle; and
subsequent to the reinstalling of the memory array into the host device, the second data set returned from the memory array resulting from the another first read cycle, and the second data set stored in the memory register, match the first data set stored in the memory array prior to the another first read cycle.

5. The method of claim 1, wherein the memory array is a ferroelectric memory array and the method further comprises flipping a portion of a plurality of ferroelectric memory cells from a first polarization vector to a second polarization vector during the performing of the first write cycle to the memory array.

6. The method of claim 1, further comprising inserting the memory array into a socket of a host device.

7. The method of claim 6, wherein the inserting of the memory array into the socket of the host device installs the memory array into a ferroelectric memory array test fixture.

8. The method of claim 1, further comprising storing a first data set into the memory array prior to the first read cycle, wherein the second data set returned from the memory array resulting from the first read cycle, and the second data set stored in the memory register, match the first data set stored in the memory array prior to the first read cycle.

9. The method of claim 1, further comprising storing a first data set into the memory array prior to the first read cycle, wherein the second data set returned from the memory array resulting from the first read cycle, and the second data set stored in the memory register, do not match the first data set stored in the memory array prior to the first read cycle.

10. A method for testing an installation of a ferroelectric memory array into a host device, the method comprising:
installing the ferroelectric memory array into the host device, the ferroelectric memory array comprising:
a plurality of word lines;
a plurality of bit lines;
a ferroelectric layer positioned between the plurality of word lines and the plurality of bit lines; and
a plurality of memory cells, wherein each memory cell comprises the ferroelectric layer at an intersection of one of the word lines and one of the bit lines, and each memory cell is configured to store a first data bit defined by a first polarization vector where the ferroelectric memory points toward the word line, and a second data bit defined by a second polarization vector where the ferroelectric memory points toward the bit line;
writing a first data set to the plurality of memory cells and storing the first data set into the plurality of memory cells of the ferroelectric memory array;
with the ferroelectric memory array installed in the host device, performing a first read cycle on the plurality of memory cells of the ferroelectric memory array, wherein the performing of the first read cycle returns a second data set from the plurality of memory cells;
storing the second data set in a memory register;
performing a first write cycle to the plurality of memory cells of the ferroelectric memory array, wherein the first write cycle comprises writing a test pattern to the ferroelectric memory array, the test pattern comprising only logic zero bits;
subsequent to performing the first write cycle, performing a second read cycle on the plurality of memory cells of the ferroelectric memory array, wherein the performing of the second read cycle returns a third data set from the ferroelectric memory array;
comparing the third data set to the test pattern;
responsive to the third data set matching the test pattern, passing the ferroelectric memory array and writing the second data set into the ferroelectric memory array, wherein the second data set is the same as the first data set; and
responsive to the third data set not matching the test pattern, failing the ferroelectric memory array, writing the second data set to the memory array that failed, and performing an analysis on results of the memory array that failed to determine a failure mode of the memory array, wherein the writing of the second data set to the memory array that failed results in the first data set being stored in the ferroelectric memory array, where the second data set is different than the first data set, wherein the failure mode comprises a failure of an entire row of memory cells, an entire column of memory cells, a single memory cell, or a group of memory cells.

11. The method of claim 10, further comprising:
responsive to the third data set not matching the test pattern, uninstalling the ferroelectric memory array from the host device responsive to the failing of the ferroelectric memory array;
reinstalling the ferroelectric memory array into the host device after the uninstalling of the ferroelectric memory array; and
performing another first read cycle on the plurality of memory cells of the ferroelectric memory array subsequent to the reinstalling of the ferroelectric memory array into the host device.

12. The method of claim 11, further comprising:
responsive to the failing of the ferroelectric memory array, incrementing a counter; and
responsive to the counter equaling a maximum value, repairing or replacing the ferroelectric memory array.

13. The method of claim 11, wherein:
prior to the reinstalling of the ferroelectric memory array into the host device, the second data set returned from the ferroelectric memory array resulting from the first read cycle, and the second data set stored in the memory register, do not match the first data set stored in the ferroelectric memory array prior to the first read cycle; and
subsequent to the reinstalling of the ferroelectric memory array into the host device, the second data set returned from the ferroelectric memory array resulting from the another first read cycle, and the second data set stored in the memory register, match the first data set stored in the ferroelectric memory array prior to the another first read cycle.

14. The method of claim 10, further comprising flipping at least a portion of the plurality of memory cells from the first polarization vector to the second polarization vector during the performing of the first write cycle to the ferroelectric memory array.

15. The method of claim 10, wherein the installing of the ferroelectric memory array into the host device comprises inserting the ferroelectric memory array into a socket of the host device.

16. The method of claim 15, wherein the inserting of the ferroelectric memory array into the socket of the host device installs the ferroelectric memory array into a ferroelectric memory array test fixture.

17. The method of claim 10, wherein the second data set returned from the ferroelectric memory array resulting from the first read cycle, and the second data set stored in the memory register, match the first data set stored in the ferroelectric memory array prior to the first read cycle.

18. The method of claim 10, wherein the second data set returned from the ferroelectric memory array resulting from the first read cycle, and the second data set stored in the memory register, do not match the first data set stored in the ferroelectric memory array prior to the first read cycle.

* * * * *